United States Patent [19]

Huusko

[11] Patent Number: 5,430,895
[45] Date of Patent: Jul. 4, 1995

[54] TRANSFORMER CIRCUIT HAVING MICROSTRIPS DISPOSED ON A MULTILAYER PRINTED CIRCUIT BOARD

[75] Inventor: Risto Huusko, Salo, Finland

[73] Assignee: Nokia Mobile Phones, Ltd., Salo, Finland

[21] Appl. No.: 963,994

[22] Filed: Oct. 20, 1992

[30] Foreign Application Priority Data

Oct. 23, 1991 [FI] Finland .................................. 915006

[51] Int. Cl.⁶ .......................... H03H 7/00; H04B 1/16
[52] U.S. Cl. ..................................... 455/327; 455/307; 455/330; 455/333; 333/177; 333/185; 333/204
[58] Field of Search ............... 455/323, 325, 327, 330, 455/333, 307, 339, 326; 333/24 R, 25, 26, 32, 175, 177, 178, 185, 204, 246

[56] References Cited

U.S. PATENT DOCUMENTS

| | | | |
|---|---|---|---|
| 4,330,868 | 5/1982 | Hallford | 455/327 |
| 4,460,877 | 7/1984 | Sterns | 333/26 |
| 5,003,622 | 3/1991 | Ma et al. | 455/327 |
| 5,017,897 | 5/1991 | Ooi et al. | 333/204 |

FOREIGN PATENT DOCUMENTS

| | | | |
|---|---|---|---|
| 90115279 | 12/1990 | European Pat. Off. . | |
| 0418538A1 | 3/1991 | European Pat. Off. | H01F 27/28 |
| 0419756 | 4/1991 | European Pat. Off. | H01P 5/10 |
| 915006 | 7/1992 | Finland . | |
| 2641438 | 6/1990 | France | H05K 1/16 |
| 1-282910 | 11/1989 | Japan | 333/204 |

OTHER PUBLICATIONS

IEEE Trans. on consumer electronics, vol. CE-27 (1981) Aug., No. 3, New York, U.S.A., An MDS Down Converter Of Thick-Film MIC For 2 GHZ Pay TV, Uwamo et al., pp. 410-415.

*Primary Examiner*—Reinhard J. Eisenzopf
*Assistant Examiner*—Chi H. Pham
*Attorney, Agent, or Firm*—Perman & Green

[57] ABSTRACT

The invention relates to a frequency selective transformer circuit integrated on a multilayer printed board and operating at radio frequencies. To the input (1) of the transformer circuit there is coupled a resonant circuit realized by microstrip conductors (8, 9) operating as a two-pole filter. With the aid of the microstrip transformer according to the invention it is also possible to realize a mixer which attenuates the image frequency.

6 Claims, 4 Drawing Sheets

TRANSFORMER CIRCUIT HAVING MICROSTRIPS DISPOSED ON A MULTILAYER PRINTED CIRCUIT BOARD

The invention relates to an integrated filter and transformer circuit operating at radio frequencies realized on a multilayer printed circuit board by stripline techniques.

BACKGROUND OF THE INVENTION

A high frequency filter, e.g. a ceramic or SAW filter has previously been used in connection with a transformer or a mixer to filter out interference signals or undesired mixing results.

FIG. 1 shows a transformer construction according to the conventional approach. The transformer is realized on a multilayer printed circuit board so that the primary 1 and the secondary 2 and 3 are located in different conductor layers. The coupling between the primary and the secondary is effected through a magnetic field. The transformer circuit frequency band is narrowed with the aid of capacitors 4 and 5, whereby the construction forms a resonant circuit.

FIG. 2 shows the frequency response of a transformer according to the conventional approach. The graph 7 represents the power distribution from port 1 into ports 2 and 3. The graph 6 illustrates the return loss of the input port. In FIG. 2 the frequency (MHz) is on the horizontal axis and the attenuation (dB) on the vertical axis. The power is equally divided between the ports 2 and 3; therefore the graph 7 comprises two superimposed curves. Due to the construction of the transformer, however, the signals have a phase difference of 180 degrees. FIG. 2 shows that it is a rather wideband transformer arrangement.

A separate high frequency filter entails costs and it consumes space on the printed board, which poses a problem when aiming at smaller total areas.

The object of the present invention is to provide a transformer with which a high frequency filter can be combined.

SUMMARY OF THE INVENTION

According to a first aspect of the present invention there is provided a transformer realized on a multilayer printed circuit board, the transformer primary being formed by a microstrip on one layer of the printed circuit board and the secondary being formed by a microstrip on another layer of the printed circuit board, wherein a resonant circuit realized by striplines is coupled to the transformer primary input to enable filtering of the input signal.

According to a second aspect of the present invention there is provided a diode mixer having interfaces for the local oscillator signal (19), for the intermediate frequency signal (21) and for the high frequency signal (16), in which the signals are mixed at a common mixing point, characterized in that between the high frequency interface and the mixing point there is a transformer as described above wherein the high frequency interface (16) is coupled to the transformer input port and the transformer output is coupled in a balanced way to the mixing point through the diode pair.

The invention combines a microstrip filter and a transformer. The invention obviates the need for a separate high frequency filter in mixer applications.

BRIEF DESCRIPTION OF THE DRAWINGS

Embodiments of the invention are described in detail below, by way of example, with reference to the accompanying drawings in which;

FIGS. 1 and 2 were described above. The approach in accordance with the invention is described below with reference to FIGS. 3-7.

DETAILED DESCRIPTION OF THE INVENTION

Figure 1:
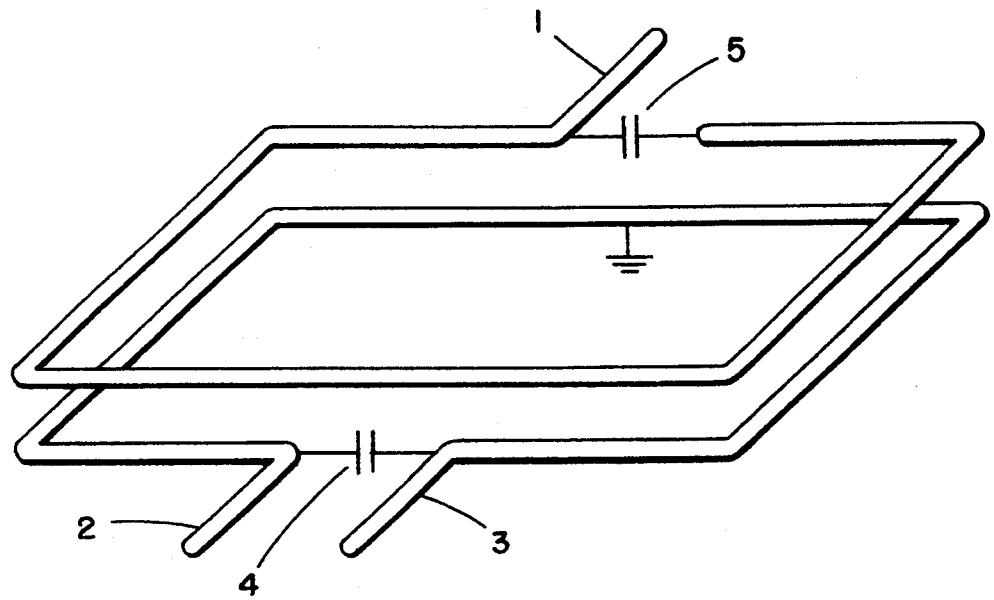
FIG. 1 shows a transformer construction in accordance with a conventional approach.
Figure 2:
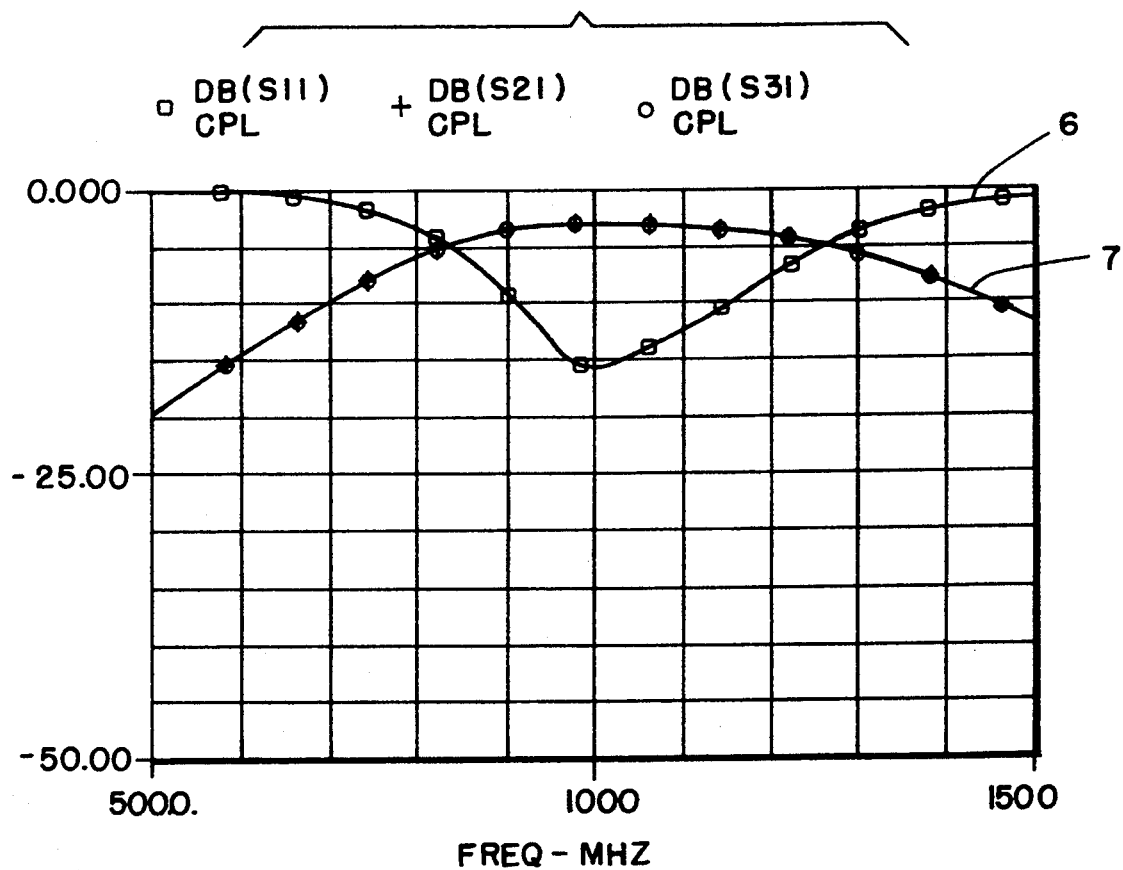
FIG. 2 shows the frequency response of a transformer according to FIG. 1.
Figure 3:
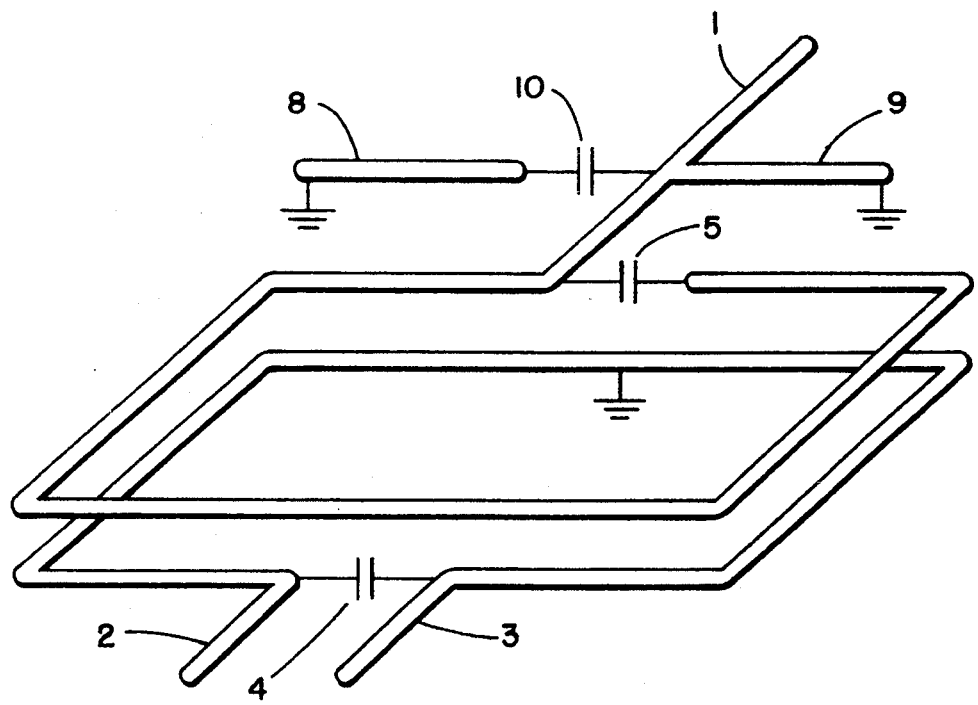
FIG. 3 shows the transformer construction in accordance with the invention.

FIG. 3 shows the construction of the transformer in accordance with the invention. A resonant circuit realized by microstrip conductors is connected to the input of the transformer circuit. Thus a two-pole filter is produced which also has a transmission zero or notch at the upper stop band. The resonant circuit comprises in parallel with the input port a stripline or a microstrip conductor 9 shorted at one end, and in parallel with it a series connection of a capacitor 10 and a microstrip conductor 8 shorted at one end.

Figure 4:
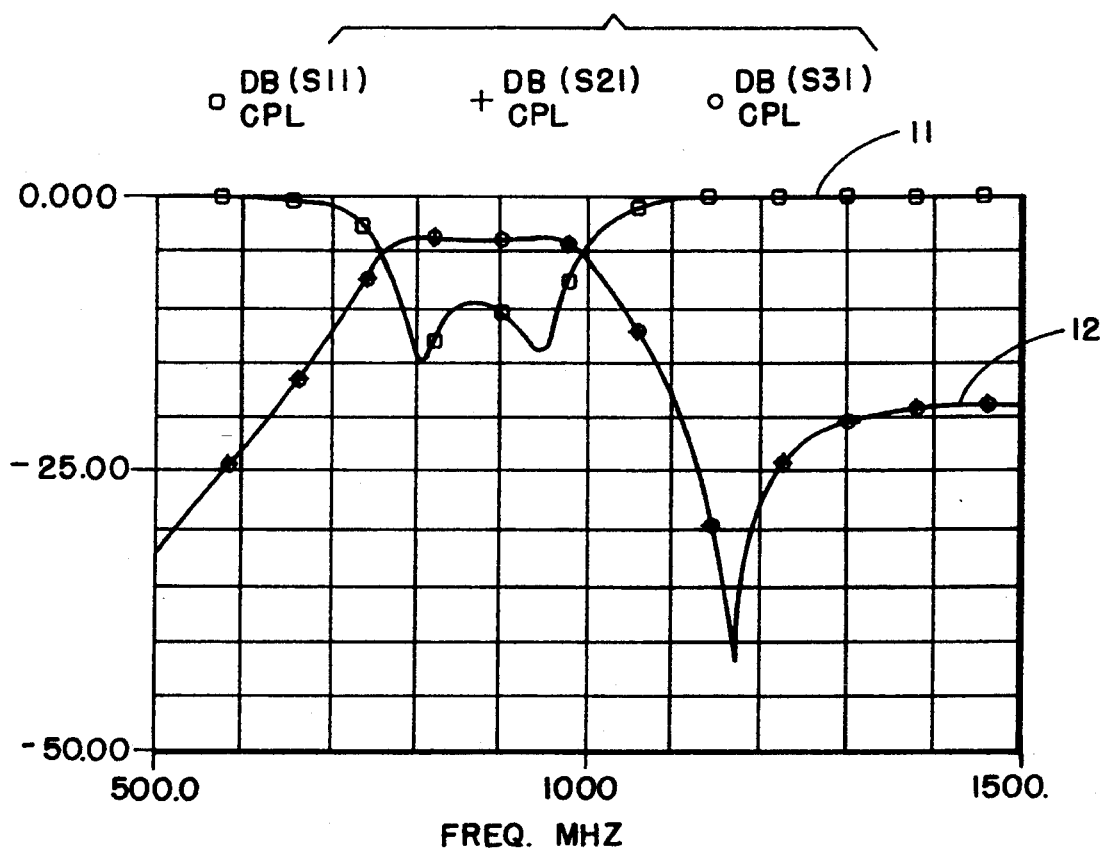
FIG. 4 shows the frequency response of the transformer according to FIG. 3.

FIG. 4 shows the frequency response of the combined transformer/resonant circuit in accordance with the invention. The graph 12 represents the power distribution from port 1 into ports 2 and 3. The graph 12 illustrates the return loss of the input port. In FIG. 4 the frequency (MHz) is on the horizontal axis and the attenuation (dB) on the vertical axis. It is seen in the figure that the circuit has become highly frequency selective. In the desired operating range (800 ... 950 MHz in the figure) the circuit operates as a transformer should. The circuit strongly attenuates input signals outside the operating range.

Figure 5:
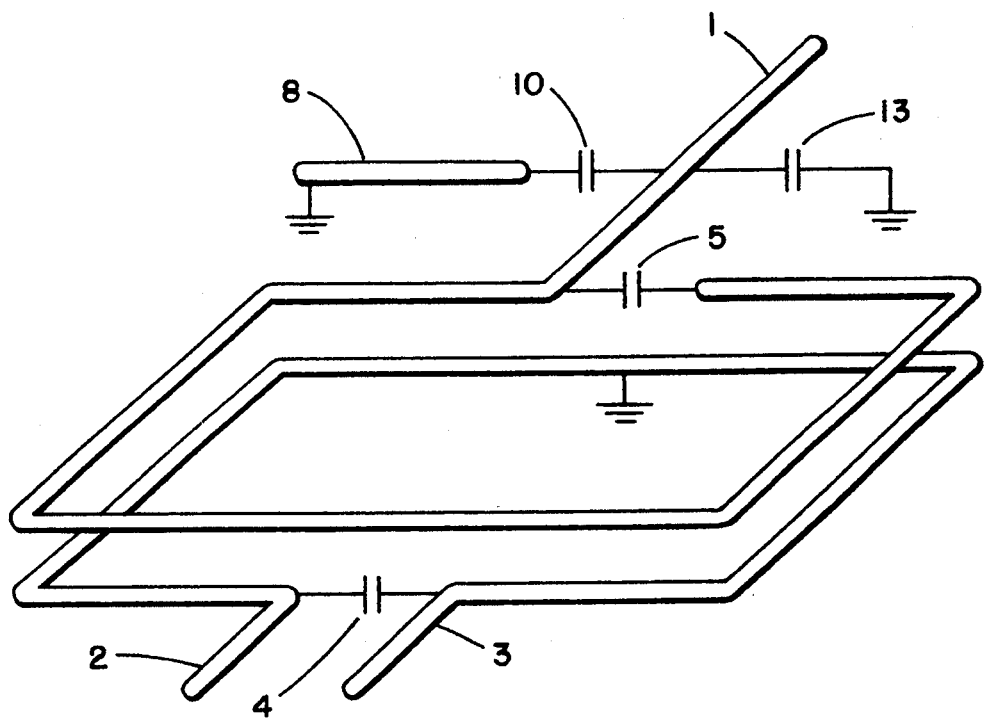
FIG. 5 shows an alternative transformer construction in accordance with the invention.

The desired frequency response of the arrangement is obtained by changing the construction of the resonant circuit connected to the transformer. FIG. 5 shows an alternative arrangement of the transformer approach in accordance with the invention, in which the shorted strip is replaced by the capacitor 13. Then the transmission zero is moved below the operating range.

Figure 6:
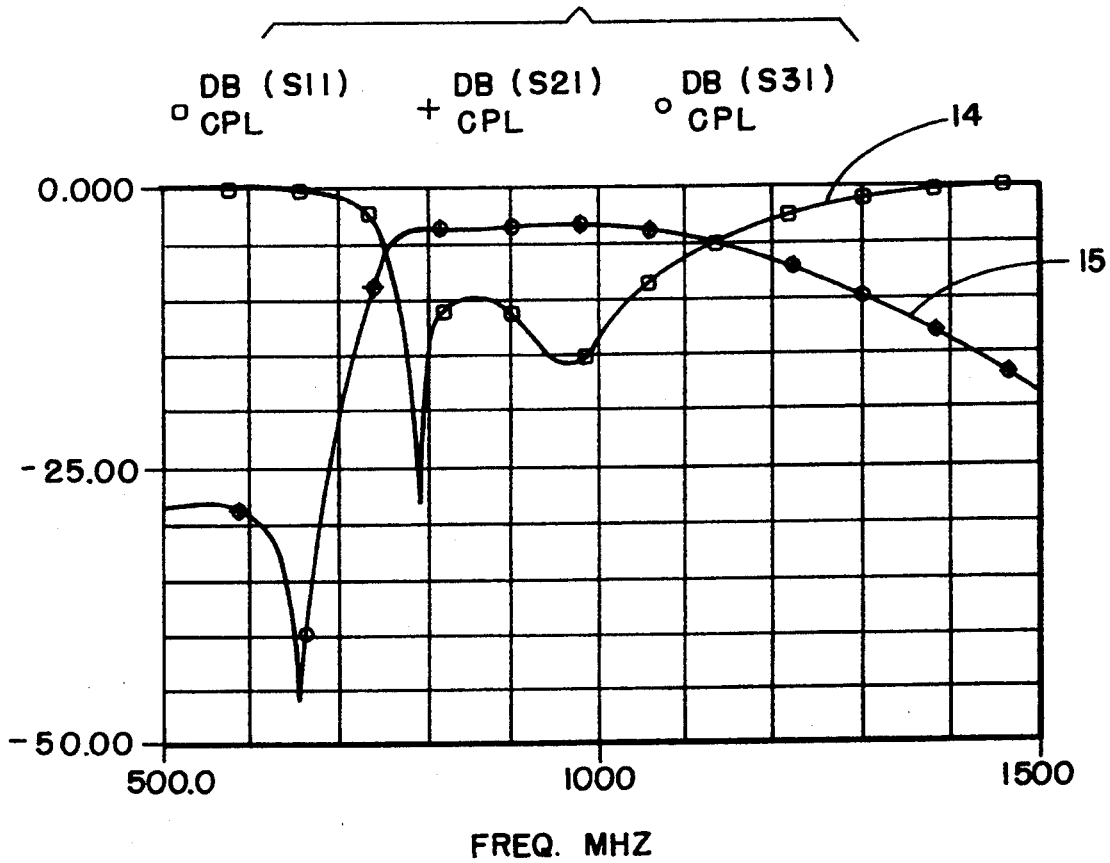
FIG. 6 shows the frequency response of the alternative transformer according to FIG. 5.

FIG. 6 shows the frequency response of the alternative transformer arrangement in accordance with the invention. The graph 15 represents the power distribution from port 1 into ports 2 and 3. The graph 14 illustrates the return loss of the input port. In FIG. 6 the frequency (MHz) is on the horizontal axis and the attenuation (dB) on the vertical axis.

Using a simpler resonant circuit, e.g. only a parallel resonant circuit, the two-pole filter construction can be realized without a transmission zero or notch.

With the invention it is possible to integrate the separate rf-filter in connection with the transformer. In this way a frequency selective transformer or power divider can be realized.

Figure 7:
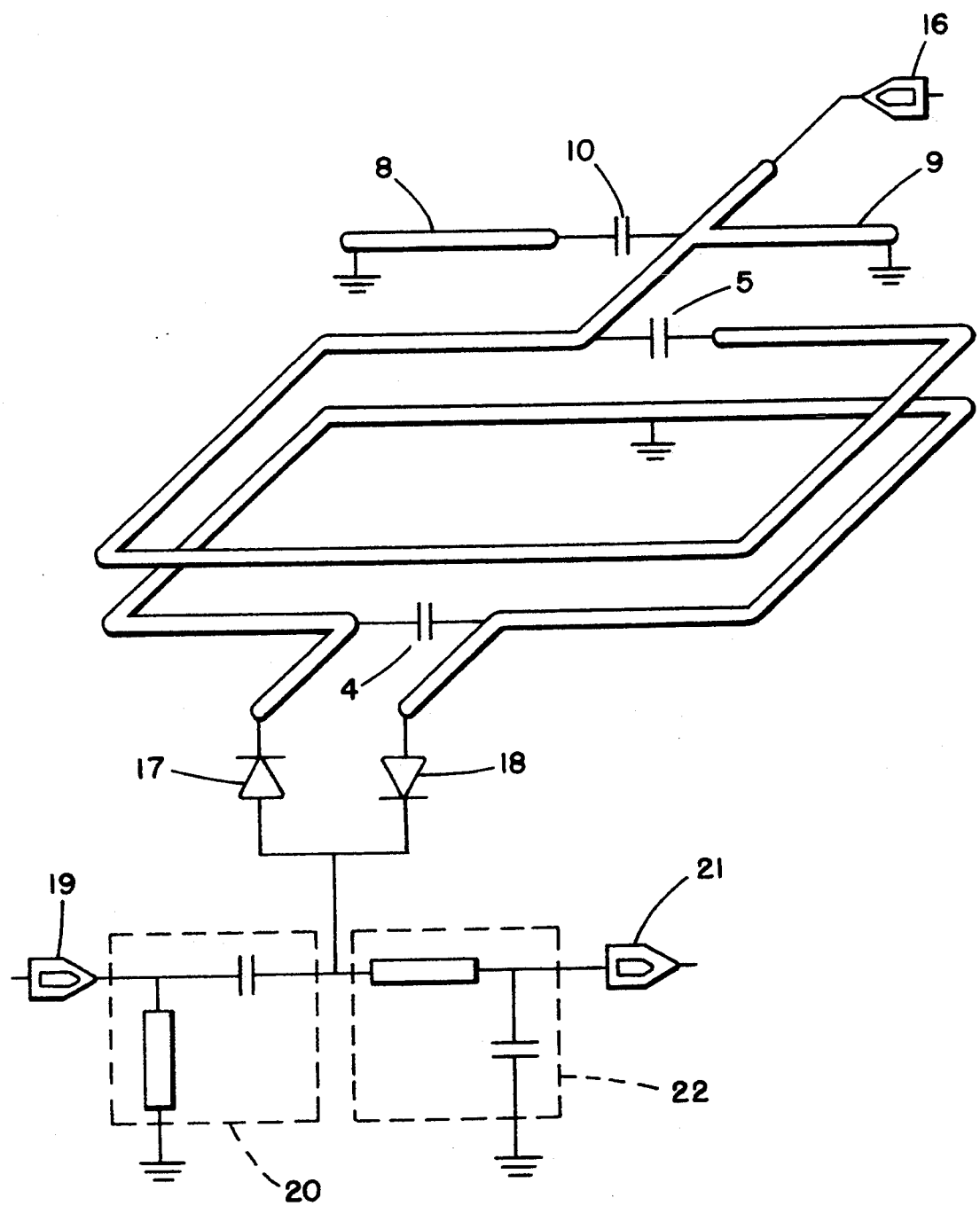
FIG. 7 the construction of a mixer in accordance with the invention which attenuates the image frequency.

The frequency selective transformer circuit can be incorporated in a mixer which attenuates the image frequency. Such a mixer is shown in FIG. 7. A high frequency signal 16 is in a balanced way supplied through the filtering transformer to the diode pair 17 and 18. The local oscillator signal 19 is supplied through the high-pass filter 20 to the middle point of the diode pair, and an intermediate frequency signal 21 is obtained from this point, filtered by the low-pass filter 22. The components 8, 9 and 10 of the resonant circuit are dimensioned so that the notch frequency equals the image frequency. This mixer arrangement can be used in the receiver of a radiotelephone to replace the commonly used series connection of an rf-filter and a mixer. The diode mixer has interfaces for the local oscillator signal, for the intermediate frequency signal and for the high frequency signal. The signals are mixed in a common mixing point. Between the high frequency interface and the mixing point there is a microstrip transformer realized on a multilayer printed board with the first circuit connected in a balanced way to the mixing point through the diode pair, and the second circuit connected to the high frequency interface, whereby to the second circuit is connected a resonant circuit realized by strip lines operating as a two-pole filter. The radio frequency signal is supplied to the second circuit of the transformer, the transformer operating to transfer a radio frequency signal to the intermediate frequency.

The filtering mixer circuit could also be used in connection with up-converting, whereby the input signals are supplied to the connectors 19 and 21 (FIG. 7) and the output signal is 16. Then this circuit filters out from the output signal undesired frequency components, which are i.a. the input signals and their harmonic components and other mixing results formed as a result of mixing. The intermediate frequency signal and the local oscillator signal are mixed and then supplied through said diodes to the first circuit of the transformer, the mixer operating to transfer the intermediate frequency signal to the radio frequency.

With the invention it is possible to remove the need to use a separate high frequency filter, or substantially to alleviate the demands made upon it. The desired frequency response of the combined filter/resonant circuit is obtained by changing the construction of the resonant circuit. Due to their simplicity, the presented implementations are preferably used in radio telephones.

In the specification and claims the term stripline is intended to cover a stripline or a microstrip conductor.

In view of the foregoing it will be clear to a person skilled in the art that modifications may be incorporated without departing from the scope of the present invention.

I claim:

1. A frequency selective transformer structure disposed on a multilayer printed circuit board, said transformer comprising a primary winding formed by a stripline on one layer of the said printed circuit board and connected to an input signal, a secondary winding formed by a stripline on another layer of the said printed circuit board, and a resonant circuit formed by striplines coupled to the said transformer primary winding for filtering the said input signal wherein the said resonant circuit is formed by a first stripline (9) in parallel with the said transformer primary winding, the said first stripline being shorted at a first end opposite the said transformer primary winding, and a first capacitor (10) and a second stripline (8) in parallel with the said transformer primary winding and in series with said first stripline (9), the said second stripline (8) being shorted at a first end opposite the said transformer primary winding.

2. A transformer structure according to claim 1 wherein the said resonant circuit further includes a second capacitor (13) in parallel with the said transformer primary winding, wherein said first capacitor (10) and said second stripline (8) are in parallel with the said transformer primary winding and in series with the said second capacitor (13), and wherein the said second stripline (8) is shorted at a first end opposite the said transformer primary winding.

3. A transformer structure according to claim 1 further including a diode mixer means including a pair of diodes connected between said secondary winding and a common mixing point, a source of local oscillator signal (19), a source of intermediate frequency signal (21) and a source of high frequency signal (16), wherein the said local oscillator, intermediate frequency and high frequency signals are mixed at the said common mixing point, and wherein the said high frequency signal source (16) is coupled to the said transformer primary winding and the transformer secondary winding is coupled in a balanced way to the said mixing point through the said diode pair.

4. A transformer structure as claimed in claim 3, wherein the said high frequency signal is a radio frequency signal coupled from said transformer primary winding to said secondary winding of the said transformer, the said diode mixer operating to convert said radio frequency signal to said intermediate frequency signal.

5. A transformer structure as claimed in claim 3, wherein the said intermediate frequency signal and the said local oscillator signal are mixed at said diode mixer and then supplied through said diodes to the said primary winding of the said transformer, thus producing said high frequency signal.

6. A transformer structure as claimed in claim 3, wherein said first stripline (9), said second stripline (8) and said capacitor (10) connected in combination to form a filter having a frequency response including a notch frequency section, and wherein said notch frequency equals the image frequency of the input RF signal.

* * * * *